(12) United States Patent
Cai et al.

(10) Patent No.: US 9,431,620 B2
(45) Date of Patent: Aug. 30, 2016

(54) ORGANIC RESISTIVE RANDOM ACCESS MEMORY AND A PREPARATION METHOD THEREOF

(71) Applicant: Peking University, Beijing (CN)

(72) Inventors: Yimao Cai, Beijing (CN); Yefan Liu, Beijing (CN); Wenliang Bai, Beijing (CN); Zongwei Wang, Beijing (CN); Yichen Fang, Beijing (CN); Ru Huang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/396,037

(22) PCT Filed: Sep. 30, 2013

(86) PCT No.: PCT/CN2013/084764
§ 371 (c)(1),
(2) Date: Oct. 21, 2014

(87) PCT Pub. No.: WO2014/183367
PCT Pub. Date: Nov. 20, 2014

(65) Prior Publication Data
US 2016/0049604 A1    Feb. 18, 2016

(30) Foreign Application Priority Data
May 13, 2013    (CN) .......................... 2013 1 0174160

(51) Int. Cl.
*H01L 45/00*    (2006.01)
*H01L 51/05*    (2006.01)
(Continued)

(52) U.S. Cl.
CPC ....... *H01L 51/0591* (2013.01); *G11C 13/0014* (2013.01); *G11C 13/0016* (2013.01);
(Continued)

(58) Field of Classification Search
CPC ....... H01L 51/05; H01L 51/40; H01L 45/08; H01L 45/1233; H01L 45/146; G11C 13/0007; G11C 2213/56
USPC ........................................ 257/4; 438/382, 99
See application file for complete search history.

(56) References Cited

U.S. PATENT DOCUMENTS

2013/0069031 A1* 3/2013 Huang ................ G11C 11/5685
257/4
2014/0145139 A1* 5/2014 Huang ................ H01L 51/0591
257/4

FOREIGN PATENT DOCUMENTS

CN    101630719 A    1/2010
CN    102222512 A    10/2011
(Continued)

*Primary Examiner* — David Vu
*Assistant Examiner* — Jonathan Han
(74) *Attorney, Agent, or Firm* — Bret E. Field; Bozicevic, Field & Francis LLP

(57) ABSTRACT

The present invention discloses an organic resistive random access memory and a preparation method thereof. The memory uses silicon as a substrate, and has a MIM capacitor structure having a vertical memory unit, where the MIM structure has a top electrode of Al, a bottom electrode of ITO, and an middle functional layer of parylene, wherein, a parylene layer as the functional layer is formed by performing deposition multiple times, where the deposition of $Al_2O_3$ is performed once by ALD between each two deposition of parylene. A critical region which is in favor of forming a conductive channel could be formed by controlling the deposition area of $Al_2O_3$, and further control the electrical characteristics of the memory. Through the present invention, the cycle-to-cycle and device-to-device uniformity could be effectively improved, without changing the basic structure of the memory.

7 Claims, 2 Drawing Sheets

(51) Int. Cl.
*G11C 13/00* (2006.01)
*H01L 51/00* (2006.01)
*H01L 51/10* (2006.01)

(52) U.S. Cl.
CPC ......... *H01L51/0035* (2013.01); *H01L 51/102* (2013.01); *H01L 2251/301* (2013.01); *H01L 2251/303* (2013.01); *H01L 2251/308* (2013.01)

(56) References Cited

FOREIGN PATENT DOCUMENTS

| | | | |
|---|---|---|---|
| CN | 102610755 A | * | 7/2012 |
| CN | 102723438 A | * | 10/2012 |
| CN | 103258957 A | | 8/2013 |
| EP | 1724851 A1 | | 11/2006 |

* cited by examiner

ORGANIC RESISTIVE RANDOM ACCESS MEMORY AND A PREPARATION METHOD THEREOF

TECHNICAL FIELD

The invention belongs to a field of organic electronics and CMOS hybrid integrated circuit technology, and particularly relates to a uniformity improved structure of an organic resistive random access memory and a preparation method thereof.

BACKGROUND OF THE INVENTION

In recent years, resistive random access memory has drawn aboard attention in the integrated circuit field. Resistive random access memory belongs to non-volatile memory, and the current market share of a nonvolatile memory is occupied mainly by flash memory. With further development of the integrated circuit, the advantages of reduction in dimension, operating voltage and other aspects of resistive random access memory make it become a potential candidate of new generation memory. The basic principle of the resistive random access memory is that, the resistance of the memory structure may achieve a reversible switching between a high resistance state ("0") and a low resistance state ("1") under the applied voltage or current, thereby achieving storing of data. In choosing the resistive switching materials, organic materials exhibit huge advantages. Organic materials have lots of varieties, simple synthesis and preparation process, and low cost. Meanwhile, organic materials may be used to achieve a transparent electronic system such as a transparent paper (e.g. e-paper), an electronic display (e.g. OLED), etc.

The uniformity of an organic resistive random access memory has always been an important research direction.

SUMMARY OF THE INVENTION

The present invention provides an organic resistive random access memory and a preparation method thereof, which improves the device uniformity based on parylene.

The present invention provides an improved resistive random access memory structure to promote the device uniformity. The functional layer in the middle of the device adopt the parylene with excellent resistive switching characteristic, and the current-voltage(I-V) characteristic curve during the resistive switching is shown in FIG. 1. In this figure, 1—a transition process of the device from the high resistance state to the low resistance state under positive voltage; 2—the low resistance state maintaining process; 3—a transition process of the device from the low resistance state to the high resistance state under negative voltage; 4—the high resistance state maintaining process. A bottom electrode of the device is grounded, and the resistance of the memory can be controlled by the voltage on the top electrode, so that the switching between a high resistance and a low resistance occurs, i.e., the switching between the two states of "0" and "1" of the memory.

The technical solutions of the present invention are offered as follows.

An organic resistive random access memory may be prepared on a silicon substrate, the memory unit is a MIM capacitor structure with a top electrode of Al, a bottom electrode of ITO (Indium tin oxide), and an middle functional layer of parylene. The device are characterized by that, a parylene layer as the functional layer is formed by performing deposition multiple times, wherein the deposition of $Al_2O_3$ is performed by using ALD (i.e., atomic layer deposition) between every two depositions of parylene. By controlling the deposition area of $Al_2O_3$, a critical region which is in favor of forming a conductive channel is formed, thereby tuning the electrical characteristics of the memory.

The parylene layer as the functional layer has a thickness between 20 nm and 80 nm.

The top electrode of Al has a thickness between 200 nm and 500 nm.

The bottom electrode of ITO has a thickness between 200 nm and 500 nm.

The $Al_2O_3$ has a thickness of 1 nm to 3 nm and an area between 100 nm×100 nm and 1 um×1 um.

The type of parylene could be parylene C, parylene N or parylene D.

Meanwhile, the present invention provides a preparation method of an organic resistive random access memory, the method comprises the steps of:

1) growing ITO on a Si substrate as a bottom electrode and patterning the bottom electrode by using standard photolithography technology, wherein the bottom electrode is formed by physical vapor deposition (PVD) process and has a thickness between 200 nm and 500 nm.

2) forming a photoresist pattern on the bottom electrode ITO by using electron beam photolithography, growing $Al_2O_3$ to a thickness of 1 nm to 3 nm by using atomic layer deposition (ALD) technology, and forming a local $Al_2O_3$ pattern by using a lift-off process;

3) growing a first parylene-C layer by using polymer CVD technology, wherein the deposition process is performed by using a parylene polymer CVD apparatus with the standard parameters. The first parylene-C layer has a thickness of 20 nm, a deposition speed is between 1 nm/min and 10 nm/min;

4) forming a photoresist pattern on the first parylene-C layer by using electron beam photolithography once more, growing $Al_2O_3$ to a thickness of 1 nm to 3 nm by using atomic layer deposition (ALD) once more, and forming a local $Al_2O_3$ pattern by using a lift-off process;

5) growing a second parylene-C layer by using polymer CVD technology, wherein the deposition is performed by using a parylene polymer CVD apparatus with standard parameters. The second parylene-C layer has a thickness of 20 nm, and a deposition speed is between 1 nm/min and 10 nm/min;

6) forming a photoresist pattern on the second parylene-C layer layer by using electron beam photolithography once more, growing $Al_2O_3$ to a thickness of 1 nm to 3 nm by using atomic layer deposition (ALD) once more, and forming a local $Al_2O_3$ pattern by using a lift-off process;

7) defining a bottom electrode-leading our via by photolithography and RIE etching;

8) sputtering Al, by PVD process, with a thickness between 200 nm and 500 nm, and defining a top electrode by conventional photolithography and lift-off processes, meanwhile the bottom electrode is led out.

The present invention has the beneficial effects that both cycle-to-cycle and device-to-device uniformity would be significantly improved, without changing the basic structure of the memory.

DETAILED DESCRIPTION OF THE EMBODIMENTS

The present invention will be further described below with reference to the accompanying drawings and the exemplary embodiments.

Embodiment 1

Figure 1:
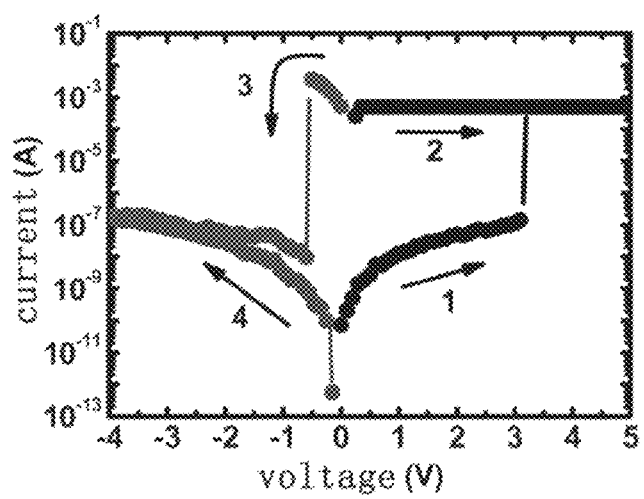
FIG. 1 is a schematic graph illustrating current-voltage curves during resistive switching of a memory of the present invention.
Figure 2:
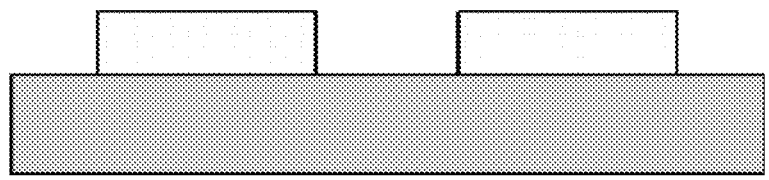
FIG. 2 to FIG. 9 show the detailed implementation steps according to an embodiment.
Figure 3:
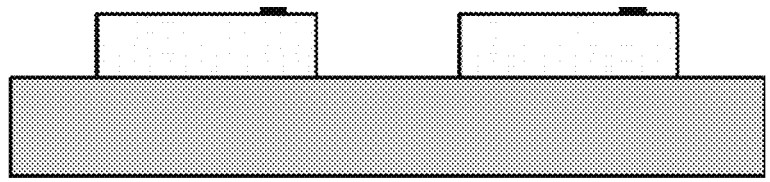
Figure 4:
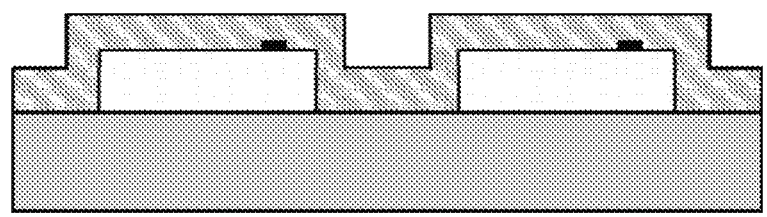
Figure 5:
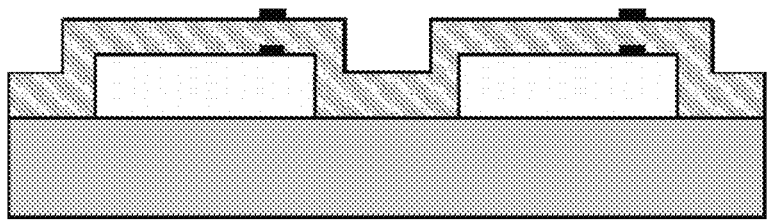
Figure 6:
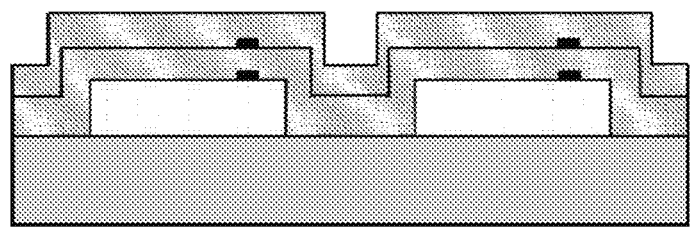
Figure 7:
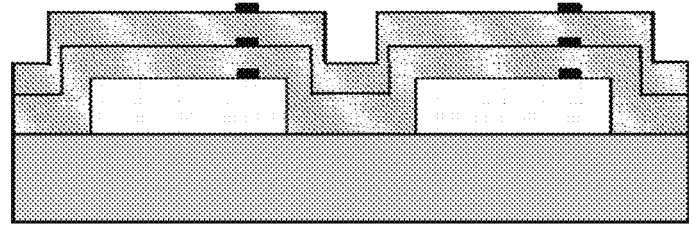
Figure 8:
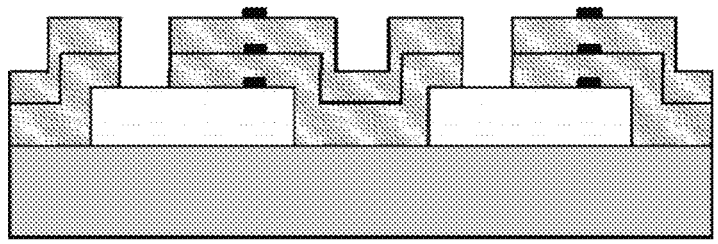
Figure 9:
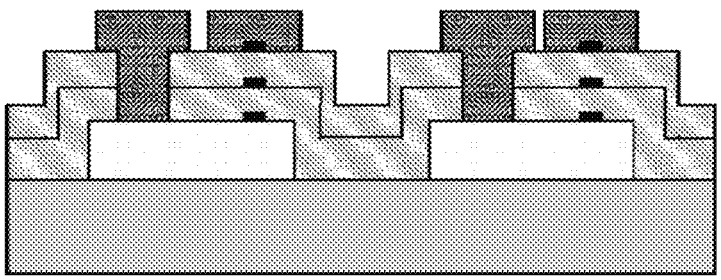
Figure 10:
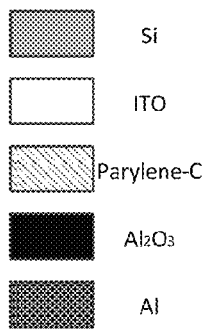
FIG. 10 shows the legend for FIG. 2 to FIG. 9.

1) ITO is grown, to a thickness between 200 nm and 500 nm, on a Si substrate as a bottom electrode by PVD process, and the bottom electrode is patterned by using standard photolithography technology, as shown in FIG. 2;

2) a photoresist pattern is formed by using electron beam photolithography, $Al_2O_3$ is grown to a thickness of 1 nm by using ALD, and a local $Al_2O_3$ pattern is formed by using a lift-off process, as shown in FIG. 3;

3) the first parylene-C layer is grown by polymer CVD, as shown in FIG. 4, wherein the first parylene-C layer has a thickness of 20 nm;

4) a photoresist pattern is formed on the first parylene-C layer by electron beam photolithography, $Al_2O_3$ is grown to 1 nm thickness by ALD, and a local $Al_2O_3$ pattern is formed by using a lift-off process, as shown in FIG. 5;

5) a second parylene-C layer is grown by polymer CVD, as shown in FIG. 6, wherein the second parylene-C layer has a thickness of 20 nm;

6) a photoresist pattern is formed on the second parylene-C layer by electron beam photolithography once more, $Al_2O_3$ is grown to 1 nm thickness by ALD, and a local $Al_2O_3$ pattern is formed by using a lift-off process, as shown in FIG. 7;

7) a bottom electrode-leading out via is defined by photolithography and RIE etching, as shown in FIG. 8;

8) Al is sputtered, to a thickness of 200 nm, by a PVD process, and a top electrode is defined by conventional photolithography and lift-off processes , meanwhile the bottom electrode is led out, as shown in FIG. 9.

What is claimed is:

1. An organic resistive random access memory, using silicon as substrate, with MIM capacitor structure having a vertical memory unit, where the MIM structure has a top electrode of Al, a bottom electrode of ITO, and an middle functional layer of parylene, wherein, a parylene layer as the functional layer is formed by performing deposition multiple times, where deposition of $Al_2O_3$ is performed once by using ALD between each twice performing of deposition of parylene, and a critical region which is in favor of forming of a conductive channel is formed by controlling a deposition area of $Al_2O_3$, thereby controlling electrical characteristics of the memory.

2. The organic resistive random access memory according to claim 1, wherein the parylene layer as the functional layer has a thickness between 20 nm and 80 nm.

3. The organic resistive random access memory according to claim 1, wherein the top electrode of Al has a thickness between 200 nm and 500 nm.

4. The organic resistive random access memory according to claim 1, wherein the bottom electrode of ITO has a thickness between 200 nm and 500 nm.

5. The organic resistive random access memory according to claim 1, wherein $Al_2O_3$ has a thickness of 1 nm to 3 nm and has a pattern having area between 100 nm×100 nm and 1 um×1 um.

6. The organic resistive random access memory according to claim 1, wherein a polymer of parylene is parylene C, parylene N or a parylene D.

7. A preparation method of an organic resistive random access memory, comprises the steps of:
1) growing ITO on a Si substrate as a bottom electrode and patterning the bottom electrode by using standard photolithography technology, wherein the bottom electrode is formed by physical vapor deposition (PVD) process and has a thickness between 200 nm and 500 nm;
2) forming a photoresist pattern on the bottom electrode of ITO by using electron beam photolithography, growing $Al_2O_3$ to a thickness of 1 nm to 3 nm by using atomic layer deposition (ALD) technology, and forming a local $Al_2O_3$ pattern by using a lift-off process;
3) growing a first parylene-C layer by using polymer CVD technology, wherein the deposition process is performed by using a parylene polymer CVD apparatus with the standard parameters, where the first layer of parylene-C layer has a thickness of 20 nm, a deposition speed is between 1 nm/min and 10 nm/min;
4) forming a photoresist pattern on the first parylene-C layer by using electron beam photolithography once more, growing $Al_2O_3$ to a thickness of 1 nm to 3 nm by using atomic layer deposition (ALD) once more, and forming a local $Al_2O_3$ pattern by using a lift-off process;
5) growing a second parylene-C layer by using polymer CVD technology, wherein the deposition is performed by using a parylene polymer CVD apparatus with standard parameters, where the second layer of parylene-C layer has a thickness of 20 nm, and a deposition speed is between 1 nm/min and 10 nm/min;
6) forming a photoresist pattern on the second parylene-C layer by using electron beam photolithography once more, growing $Al_2O_3$ to a thickness of 1 nm to 3 nm by using atomic layer deposition (ALD) once more, and forming a local $Al_2O_3$ pattern by using a lift-off process;
7) defining a bottom electrode-leading out via by photolithography and RIE etching;
8) sputtering Al, by PVD process, with a thickness between 200 nm and 500 nm, and defining a top electrode by conventional photolithography and lift-off processes, meanwhile the bottom electrode is led out.

\* \* \* \* \*